(12) United States Patent
Liang et al.

(10) Patent No.: US 11,387,822 B2
(45) Date of Patent: Jul. 12, 2022

(54) FILTER AND METHOD WITH MULTIPLICATION OPERATION APPROXIMATION CAPABILITY

(71) Applicant: xMEMS Labs, Inc., Santa Clara, CA (US)

(72) Inventors: Jemm Yue Liang, Sunnyvale, CA (US); Hsi-Sheng Chen, Fremont, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/399,071

(22) Filed: Aug. 11, 2021

(65) Prior Publication Data

US 2022/0085799 A1 Mar. 17, 2022

Related U.S. Application Data

(60) Provisional application No. 63/079,680, filed on Sep. 17, 2020.

(51) Int. Cl.
| | |
|---|---|
| *H03K 5/1252* | (2006.01) |
| *G06F 7/523* | (2006.01) |
| *G06F 7/487* | (2006.01) |
| *H03H 17/02* | (2006.01) |

(52) U.S. Cl.
CPC ......... *H03K 5/1252* (2013.01); *G06F 7/4876* (2013.01); *G06F 7/523* (2013.01); *H03H 17/0248* (2013.01)

(58) Field of Classification Search
CPC .......... H03H 2017/0072–009; H03H 17/0225; H03H 17/0227
See application file for complete search history.

(56) References Cited

U.S. PATENT DOCUMENTS

| | | | |
|---|---|---|---|
| 7,565,389 B2* | 7/2009 | Runze | H03H 17/0225 708/319 |
| 2005/0008071 A1* | 1/2005 | Bose | H03H 17/0225 375/233 |
| 2006/0218213 A1* | 9/2006 | Shehata | H03H 17/0227 708/300 |
| 2021/0287650 A1* | 9/2021 | Wada | G10K 11/17853 |

* cited by examiner

*Primary Examiner* — Matthew D Sandifer
(74) *Attorney, Agent, or Firm* — Winston Hsu (57) ABSTRACT

A filter is disclosed. The filter includes at least one first multiplication approximation unit, for approximating at least one first multiplication operation corresponding to at least one first coefficient with at least one first bit-wise shift operation; and at least one second multiplication approximation unit, for approximating at least one second multiplication operation corresponding to at least one second coefficient with a plurality of second bit-wise shift operations and at least one addition operation.

14 Claims, 7 Drawing Sheets

FILTER AND METHOD WITH MULTIPLICATION OPERATION APPROXIMATION CAPABILITY

CROSS REFERENCE TO RELATED APPLICATIONS

This application claims the benefits of U.S. Provisional Application No. 63/079,680 filed on Sep. 17, 2020, which are incorporated herein by reference.

BACKGROUND OF THE INVENTION

1. Field of the Invention

The present application relates to a filter and method for an application-specific integrated circuit (ASIC), and more particularly, to a filter and method capable of approximating multiplication operation for the ASIC.

2. Description of the Prior Art

A bi-quadratic (BiQuad) filter is a second-order filter commonly employed in signal processing. In the discrete-time domain, the input/output relation of a BiQuad filter may be expressed as equation (Eq.) 1:

$$y(n)=b_0x(n)+b_1x(n-1)+b_2x(n-2)-a_1y(n-1)-a_2y(n-2) \quad \text{Eq. 1}$$

By properly choosing the coefficients $[a_1, a_2, b_0, b_1, b_2]$, a BiQuad filter may function as a low-pass, high-pass, band-pass, peak, notch, low-shelf or high-shelf filter according to a set of specified parameters such as sampling frequency, center/cutoff frequency $f_c$, Q-factor and gain.

Figure 1:
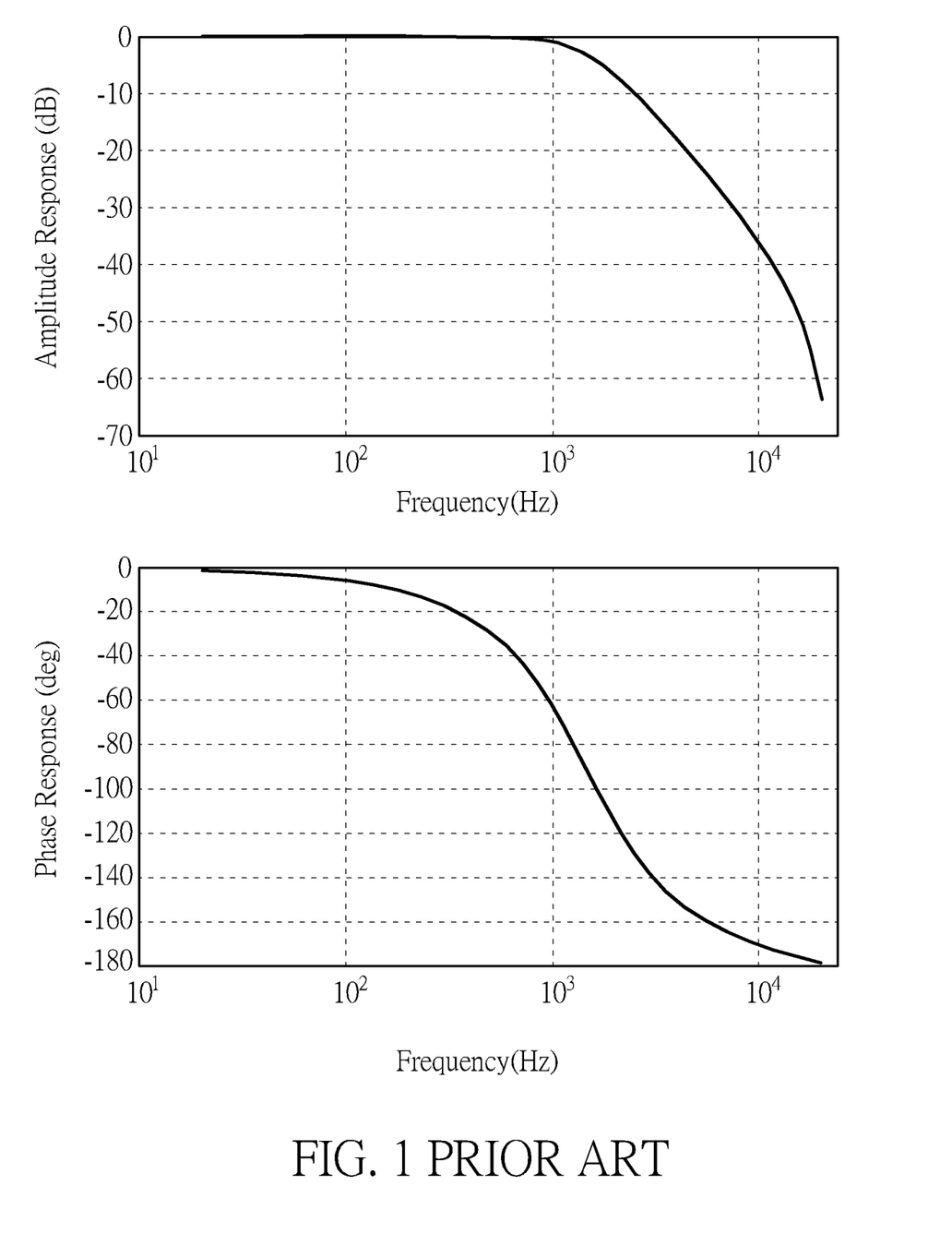
FIG. 1 illustrates amplitude response and phase response of a BiQuad filter.

For example, please refer to FIG. 1, which illustrates amplitude response and phase response of a BiQuad filter. As shown in FIG. 1, when the discrete-time signals are sampled at a rate of 48 ksps (kilo-samples per second), a BiQuad filter with the coefficients in a table 1 may function as a $2^{nd}$ order low-pass filter with $f_c=1439.244251$ Hz, Q=0.7071 and a unit DC-gain.

TABLE 1

| |
|---|
| $a_1 = -1.734863758990959$ |
| $a_2 = 0.766113758997616$ |
| $b_0 = 0.007812500001664$ |
| $b_1 = 0.015625000003329$ |
| $b_2 = 0.007812500001664$ |

However, the above BiQuad filter may require five multiplications, four additions and register several assignment operations. Floating point multiplication, especially 64-bit double precision floating point numbers required for the expressing coefficients in the table 1, is an expensive operation that not only takes significant amount of hardware resources and computation cycles but also consumes significant amount of power.

Therefore, it is necessary to improve the prior art.

SUMMARY OF THE INVENTION

It is therefore a primary objective of the present application to provide a filter and method capable of approximating multiplication operation, to improve over disadvantages of the prior art.

An embodiment of the present application discloses a filter. The filter includes at least one first multiplication approximation unit, for approximating at least one first multiplication operation corresponding to at least one first coefficient with at least one first bit-wise shift operation; and at least one second multiplication approximation unit, for approximating at least one second multiplication operation corresponding to at least one second coefficient with a plurality of second bit-wise shift operations and at least one addition operation.

Another embodiment of the present application discloses a method. The method includes approximating at least one first multiplication operation corresponding to at least one first coefficient with at least one first bit-wise shift operation; and approximating at least one second multiplication operation corresponding to at least one second coefficient with a plurality of second bit-wise shift operations and at least one addition operation.

Another embodiment of the present application discloses a filter. The filter includes at least one first multiplication approximation unit, for approximating at least one first multiplication operation corresponding to at least one first coefficient with at least one first bit-wise shift operation.

These and other objectives of the present invention will no doubt become obvious to those of ordinary skill in the art after reading the following detailed description of the preferred embodiment that is illustrated in the various figures and drawings.

DETAILED DESCRIPTION

Since multiple stages of a BiQuad filter may be used in a system, connecting M stages of the BiQuad filter in cascade results in a 2M-order filter. Under such an arrangement, the input of a stage comes from the output of the previous stage while the output is connected to the input of the next stage.

Figure 2:
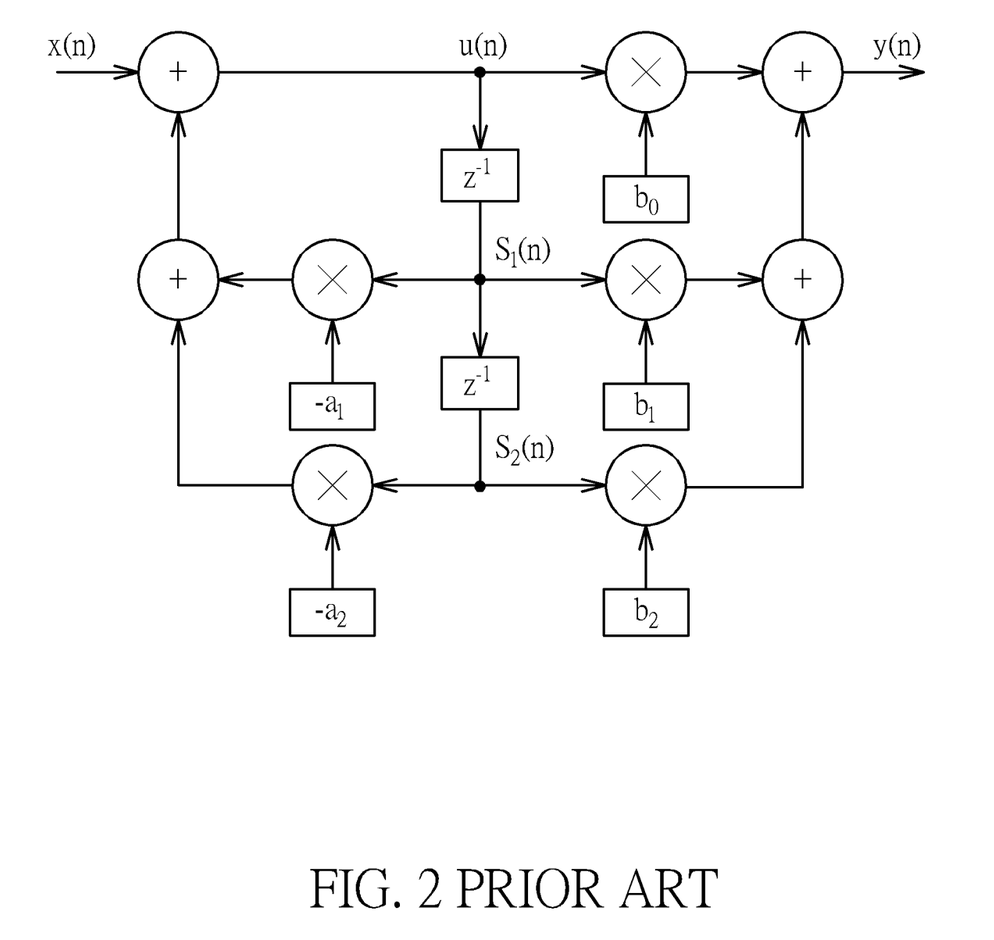
FIG. 2 is a schematic diagram of a BiQuad filter in Direct Form II.

Please refer to FIG. 2, which is a schematic diagram of a conventional BiQuad filter 20 in Direct Form II. As shown in FIG. 2, since x(n) is an input signal, y(n) is an output signal and $z^{-1}$ is a delay element, the data processing flow of signals of the BiQuad filter 20 may be expressed as:

```
n = 0 ;
do {
    s_2(n) = s_1(n - 1) ;
    s_1(n) = u(n - 1) ;
```

```
    u(n) = x(n) − a₁s₁(n) − a₂s₂(n) ;
    y(n) = b₀ u(n) + b₁ s₁(n) + b₂ s₂(n) ;
    n = n + 1 ;
}
```

Under such a situation, each iteration in the processing of the BiQuad filter 20 requires five multiplications, four additions and several register assignment operations. As mentioned in the above, floating point multiplication is an expensive operation that not only takes significant amount of hardware resources and computation cycles but also consumes significant amount of power. Silicon area, computation cycles and power are all precious resource for digital systems, it is therefore highly desirable to have a realization of a BiQuad filter while minimizing the use of floating point multiplier.

When a BiQuad filter is designed in an application-specific integrated circuit (ASIC), arithmetic operations are performed with finite precision. All the variables and constants are represented with finite number of bits. It is inevitable to have errors between the ideal design goal and the actual results produced by a specific digital implementation. Choosing proper precision, or equivalently the number of bits, to represent each of the coefficients existing in the design is critical. The present application aims at the implementations of a BiQuad filter that employ dramatically simplified arithmetic operations and, accordingly, require much less hardware resources while being able to achieve results comparable to that of floating-point arithmetic operations.

Figure 3:
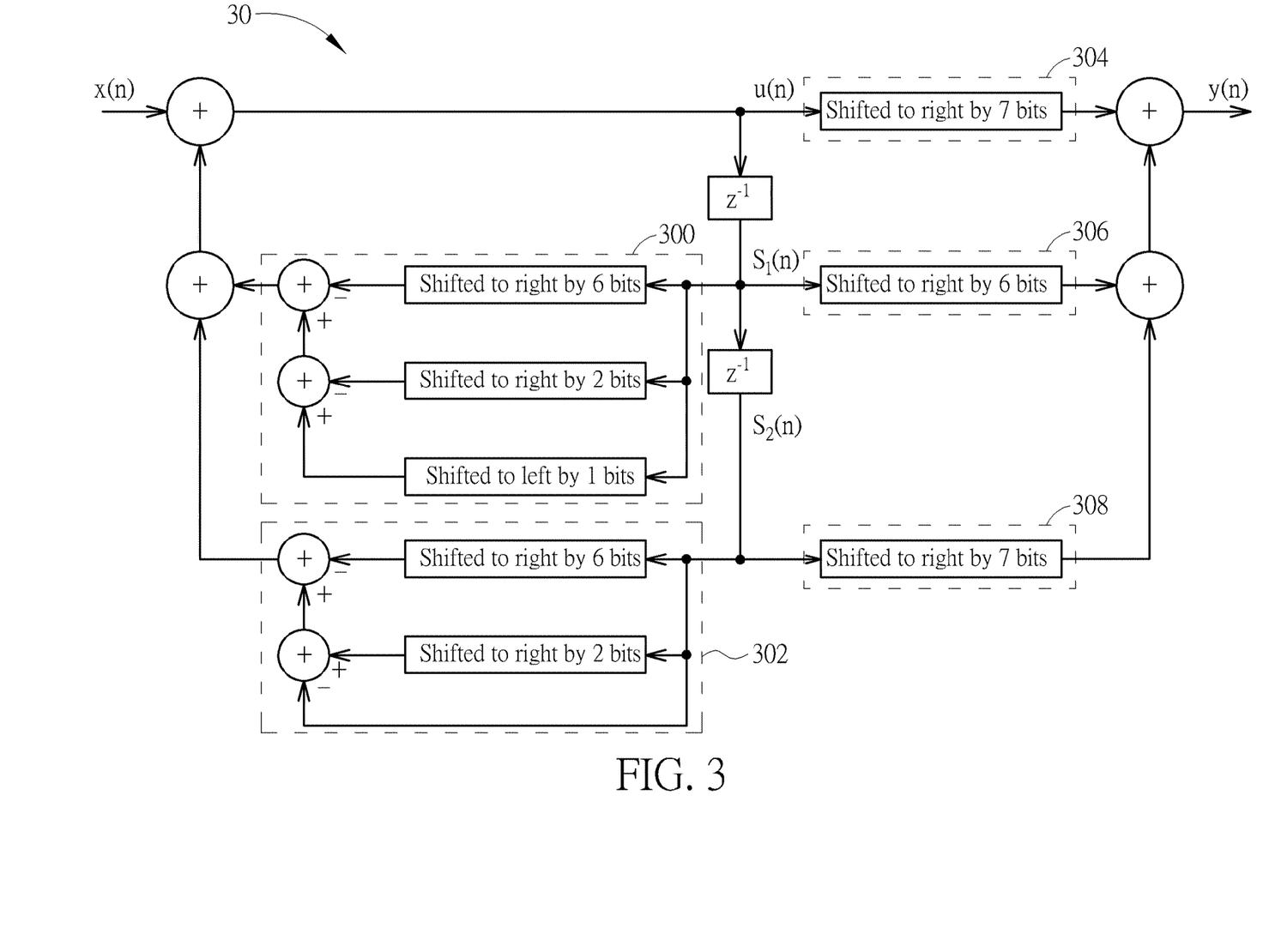
FIG. 3 is a schematic diagram of a BiQuad filter according to an embodiment of the present application.
Figure 4:
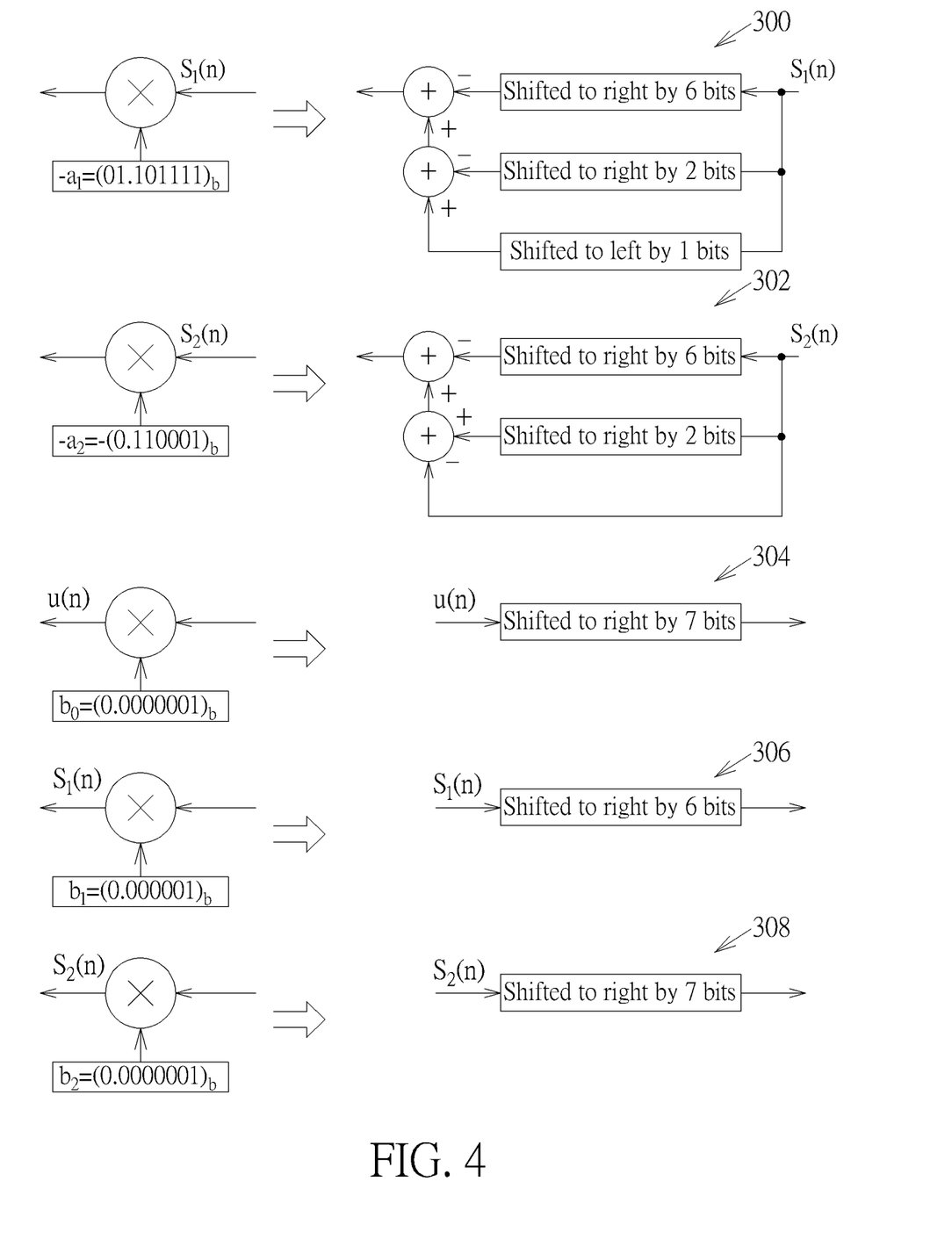
FIG. 4 is a schematic diagram of conversions of multiplication approximation units of the BiQuad filter shown in FIG. 3 according to an embodiment of the present application.

Please refer to FIG. 3 and FIG. 4. FIG. 3 is a schematic diagram of a BiQuad filter 30 according to an embodiment of the present application, and FIG. 4 is a schematic diagram of conversions of multiplication approximation units 300-308 of the BiQuad filter 30 according to an embodiment of the present application. As shown in FIG. 3 and FIG. 4, the multiplication approximation units 304, 306, 308 approximate multiplication operations corresponding to at least one coefficients $b_0$, $b_1$, $b_2$ with bit-wise shift operations, respectively, and the multiplication approximation units 300, 302 approximate multiplication operations corresponding to at least one coefficients $a_1$, $a_2$ with bit-wise shift operations and addition operations, respectively. As a result, the present application may approximate multiplication operations with bit-wise shift operations to save hardware resources.

In detail, by selecting a proper corner frequency ($f_C$) and a quality factor (Q), multiplication operations by coefficients $b_0$, $b_1$ and $b_2$ become equivalent to bit-wise shift operations as shown in in a table 2 below ($f_s$ is a sample rate). Since bit-wise shift operations may be realized by wiring in ASIC design, the resulting implementation of multiplication utilizes no logic gates, takes up no silicon space and consumes no power. In other words, this first step of implementing the BiQuad filter 30 involves choosing suitable combinations of the corner frequency $f_C$ and the quality factor Q, and converts the floating point multiplication operations involving the coefficients $b_0$, $b_1$, $b_2$ into no-cost bit-wise rewiring in the ASIC. Then, in the $2^{nd}$ step of implementing the BiQuad filter 30, the coefficients $b_0$, $b_1$, $b_2$ are finely tuned, such that each of the two floating-point multiplication operations involving coefficients $a_1$, $a_2$ becomes bit-wise shift operations and 2~3 fixed point addition operations.

TABLE 2

| $f_C$ at 3.072 Msps | $f_C$ at 48 ksps | $f_C/f_s$ | Q | $b_0$, $b_2$ | $b_1$ |
|---|---|---|---|---|---|
| 293,596.34 | 4,587.44 | 0.09557173 | 0.7071 | 4 | 3 |
| 196,647.43 | 3,072.62 | 0.06401283 | 0.7071 | 5 | 4 |
| 133,818.77 | 2,090.92 | 0.04356080 | 0.7071 | 6 | 5 |
| 92,111.63 | 1,439.24 | 0.02998426 | 0.7071 | 7 | 6 |
| 63,915.58 | 998.681 | 0.02080585 | 0.7071 | 8 | 7 |
| 44,600.77 | 696.887 | 0.01451848 | 0.7071 | 9 | 8 |
| 31,245.41 | 488.210 | 0.01017103 | 0.7071 | 10 | 9 |
| 21,949.60 | 342.963 | 0.00714505 | 0.7071 | 11 | 10 |
| 32,991.13 | 2,061.95 | 0.04295720 | 0.8409 | 6 | 5 |
| 22,800.87 | 1,425.05 | 0.02968863 | 0.8409 | 7 | 6 |

Specifically, considering a case where the corner frequency $f_C \approx 1439.24$ Hz at 48 ksps, the quality factor $Q \approx 0.707$ with the following approximations of the coefficients of multiplication operations (converting the coefficients of table 1 with $4^{th}$ row of the table 2 by approximating each coefficient by a sum of one term (e.g. $b_0$, $b_1$, $b_2$) or more terms (e.g. $a_1$, $a_2$) with each term containing only one '1' in its binary expression):

$a_1 = -1.734863758990959 \approx -(1.734375) = -(01.101111)_b = (0.01)_b + (0.000001)_b - (010.0)_b$ $a_2 = 0.766113758997616 \approx 0.765625 = (0.110001)_b = (01.0)_b - (0.01)_b + (0.000001)_b$ $b_0 = 0.007812500001664 \approx 0.0078125 = (0.0000001)_b$ $b_1 = 0.015625000003329 \approx 0.015625 = (0.000001)_b$ $b_2 = 0.007812500001664 \approx 0.0078125 = (0.0000001)_b$ where the notation $( )_b$ is the two's-complement binary representation of a number. For example, $1.25 = (01.01)_b$, $0.15625 = (0.00101)_b$, etc.

As shown in FIG. 4, instead of a floating-point multiplication operation, the multiplication operation of $-a_1 s_1(n)$ may be calculated as $-a_1 s_1(n) = s_1(n) \times (010.0)_b - s_1(n) \times (0.01)_b - s_1(n) \times (0.000001)_b = [s_1(n)$ binary form shifted to the left by 1 bit$] - [s_1(n)$ binary form shifted to the right by 2 bits$] - [s_1(n)$ binary form shifted to the right by 6 bits$]$ As a result, three no-cost bit-wise rewiring will address the need of any multiplication operation, and it takes only two integer addition operations to approximate the floating point multiplication operation. By the same token, the multiplication operation of $-a_2 s_2(n)$ in FIG. 2 can be obtained through two addition operations as shown in FIG. 4.

For those multiplication operations corresponding to the coefficients $b_0$, $b_1$ and $b_2$, since the coefficients $b_0$, $b_1$ and $b_2$ are respectively approximated by a number with only one '1' in their binary expressions, each of the multiplication operations may be obtained by just one no-cost bit-wise shift operation; for instance, $b_0 u(n) \approx u(n) \times (0.0000001)_b = u(n)$ shifted to the right by 7 bits. Conversions of all six multiplications in a BiQuad filter by shift operations and addition operations are illustrated in FIG. 4.

As shown in FIG. 3, by applying all the approximations of filter coefficients and replacing the multiplications with shift operations and addition operations, the BiQuad filter 20 in FIG. 2 may be significantly simplified to the BiQuad filter 30 that does not use any multiplier as illustrated in FIG. 3. It is worth mentioning that in a hardware implementation, the shift operation does not require any hardware component; it only requires rearranging the wiring of data bus, and therefore occupies no hardware resources and consumes no power.

Note that the corner frequency $f_C \approx 1439.24$ Hz is relative to 48 Ksps sample rate. The same set of parameters above may produce the corner frequency $f_C \approx 23{,}028$ Hz at 768 Ksps sample rate, the corner frequency $f_C \approx 28{,}785$ Hz at 960 Ksps sample rate, the corner frequency $f_C \approx 46{,}056$ Hz at 1536 Ksps sample rate, or the corner frequency $f_C \approx 92{,}111.63$ Hz at 3072 Ksps sample rate etc. (i.e. with the same $f_C/f_s$).

Figure 5:
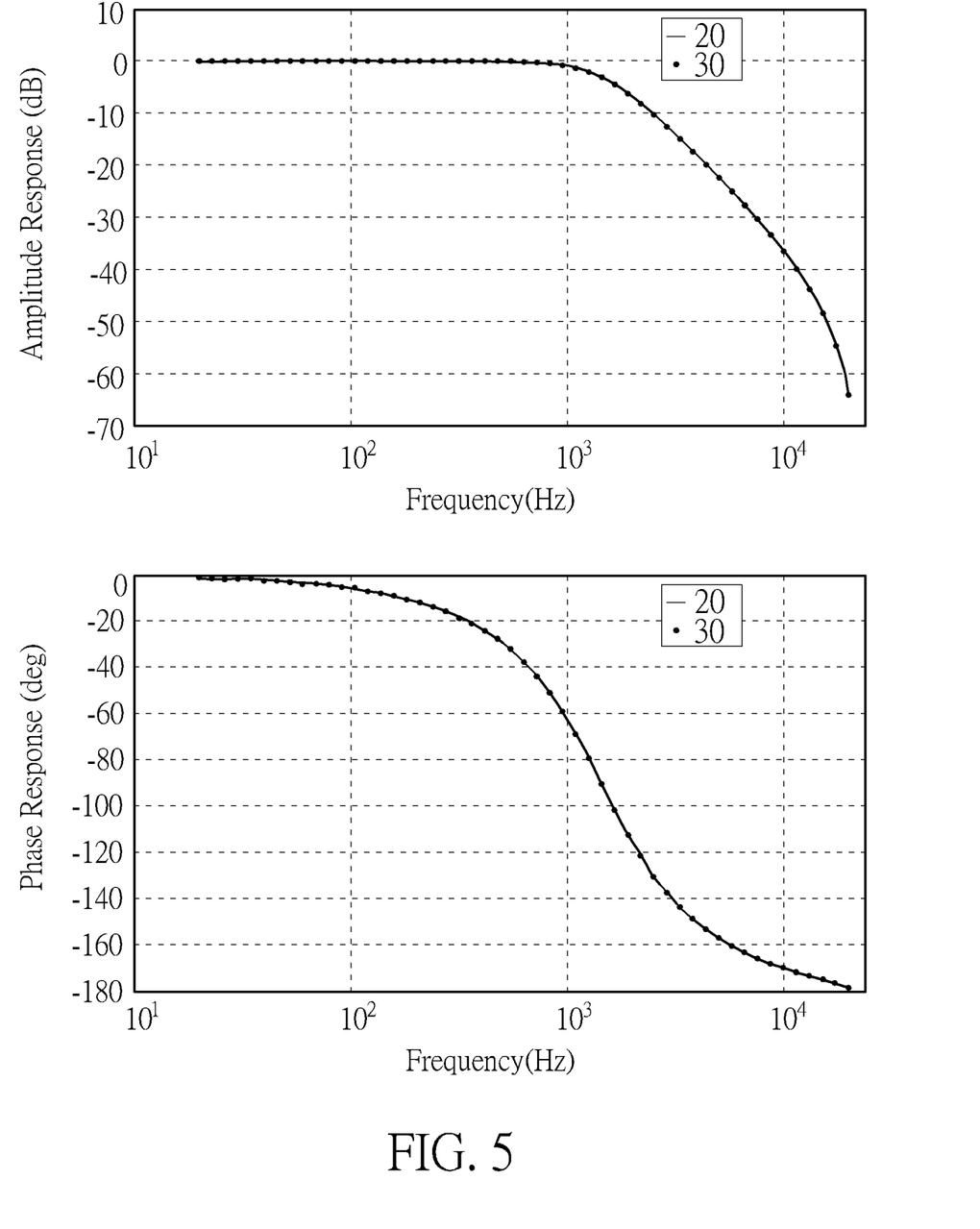
FIG. 5 illustrates amplitude response and phase response of the BiQuad filter shown in FIG. 3 according to an embodiment of the present application.

Please refer to FIG. 5, which illustrates amplitude response and phase response of the BiQuad filter 30 according to an embodiment of the present application. As shown in FIG. 5, simulations of the BiQuad filter 30 using 24-bit fixed-point arithmetic show a frequency response matching well that of the BiQuad filter 20 employing double-precision floating-point arithmetic. The solid curves show the frequency response of the BiQuad filter 20 when all the calculations are carried out in double-precision floating-point arithmetic. The dotted curves display the frequency response of the BiQuad filter 30 employing only shift operations and 24-bit fixed-point addition operations detailed in the above.

The precisions employed for the variables in the simulations are 16-bit word-length/15-bit fraction-length for the input and output, and 24-bit word-length/17-bit fraction-length for the states and accumulators. In both amplitude and phase responses, the errors between two curves are negligible.

To summarize, the procedures to choose filter coefficients [$a_1$, $a_2$, $b_0$, $b_1$, $b_2$] that may significantly simplify the implementation of a digital BiQuad filter involve (1) Approximate each coefficient by one term (e.g. $b_0$, $b_1$, $b_2$) or a sum-of-terms (e.g. $a_1$, $a_2$) with each term containing only one '1' in its binary expression.

(2) The sum-of-terms representation should consist as few terms as possible. Each term corresponds to a shift operation in the simplified BiQuad filter 30.

(3) Verify that the coefficients employed result in a stable filter.

Figure 6:
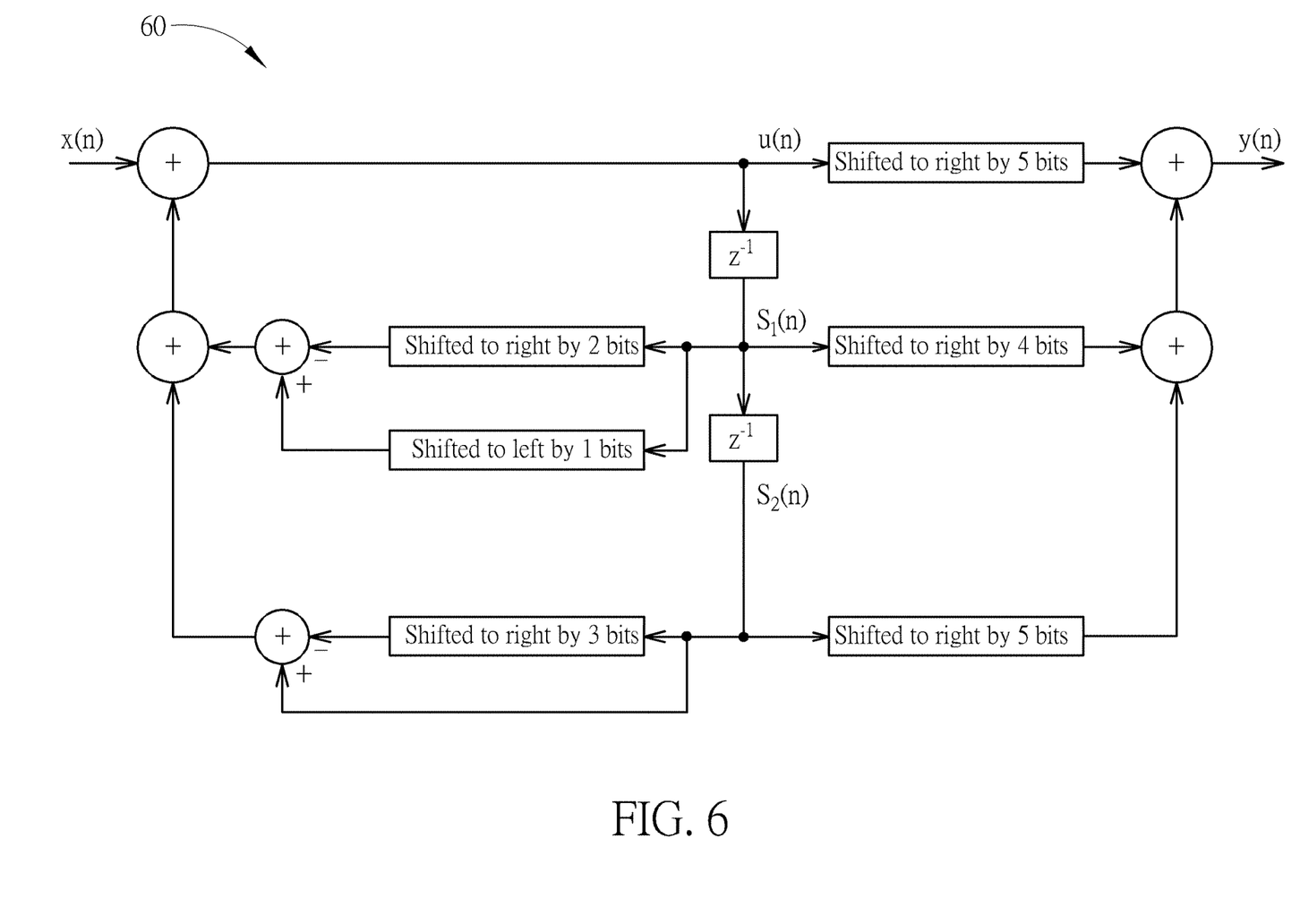
FIG. 6 is a schematic diagram of a BiQuad filter according to another embodiment of the present application.

Please refer to FIG. 6, which is a schematic diagram of a BiQuad filter 60 according to another embodiment of the present application. In this embodiment, to further simplify the realization of a digital BiQuad, different approximations of the filter coefficients $a_1$ and $a_2$ are applied as follows (i.e. a different set of shift bit numbers of bit-wise shift operations and addition numbers of addition operations are corresponding to the same specific set of the corner frequency $f_C \approx 1439.24$ Hz at 48 ksps and the quality factor $Q \approx 0.707$):

$a_1 = -1.734863758990959 \approx -(1.75) = -(01.11)_b = (0.01)_b - (010.0)_b$ $a_2 = 0.766113758997616 \approx 0.875 = (0.111)_b = (01.0)_b - (0.001)_b$ Additionally, to get the BiQuad filter 60 with unit DC-gain, the coefficients $b_0$, $b_1$ and $b_2$ are scaled by a factor of 4:

$b_0 \approx 4 \times 0.0078125 = (0.00001)_b$ $b_1 \approx 4 \times 0.015625 = (0.0001)_b$ $b_2 \approx 4 \times 0.0078125 = (0.00001)_b$ The multiplication operation corresponding to the coefficient $a_1$ may be replaced by two shift operations and one addition operation, the multiplication operation corresponding to the coefficient $a_2$ may be replaced by one shift operation and one addition operation, and each of the multiplication operations corresponding to the coefficients $b_0$, $b_1$ or $b_2$ may be replaced by 1 shift operation. As shown in FIG. 6, the BiQuad filter 60 requires two less addition operations and two less shift operations than the BiQuad filter 30.

Figure 7:
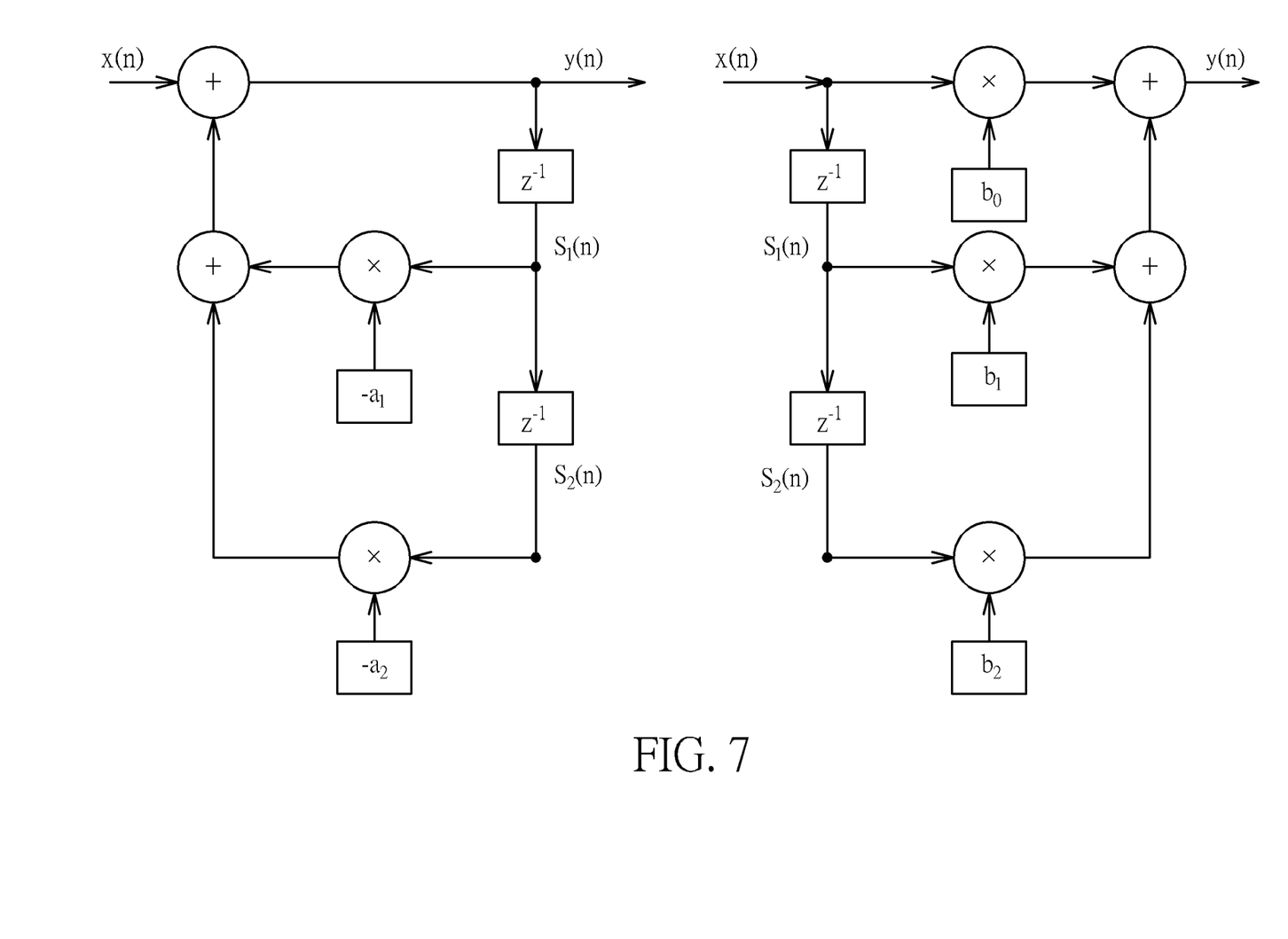
FIG. 7 is a schematic diagram of an all-pole filter and an all-zero filter.

Noticeably, the above embodiments are all for a BiQuad filter. Nevertheless, the approach of using approximate filter coefficients to avoid the use of multipliers and simplify the implementation may be applied to other types of filters or digital signal processors that require multiplication operations. For example, by using the similar rationale, the replacement of coefficient multiplication may be applied to all-poles filter, as shown in left portion of FIG. 7, or all-zero filter, as shown in right portion of FIG. 7, which is also within the scope of the present application.

To sum up, the present application approximates multiplication operations with bit-wise shift operations to save hardware resources.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter, the filter comprising:
   at least one first multiplication approximation circuit, for approximating at least one first multiplication operation corresponding to at least one first coefficient with at least one first bit-wise shift operation; and
   at least one second multiplication approximation circuit, for approximating at least one second multiplication operation corresponding to at least one second coefficient with a plurality of second bit-wise shift operations and at least one addition operation,
   wherein values of a first shift bit number, a second shift bit number and a third shift bit number of at least one shift bit number of the at least one first bit-wise shift operation and values of corner frequencies and quality factors are selected from values of one row of a table below with variation less than 1% for the corner frequencies and the quality factors:

| Corner frequency at 3072 ksps (kilo-samples per second) | Corner frequency at 48 ksps | Quality factor | First/third shift bit number | Second shift bit number |
| --- | --- | --- | --- | --- |
| 293,596.34 | 4,587.44 | 0.7071 | 4 | 3 |
| 196,647.43 | 3,072.62 | 0.7071 | 5 | 4 |
| 133,818.77 | 2,090.92 | 0.7071 | 6 | 5 |
| 92,111.63 | 1,439.24 | 0.7071 | 7 | 6 |
| 63,915.58 | 998.681 | 0.7071 | 8 | 7 |
| 44,600.77 | 696.887 | 0.7071 | 9 | 8 |
| 31,245.41 | 488.210 | 0.7071 | 10 | 9 |
| 21,949.60 | 342.963 | 0.7071 | 11 | 10 |
| 32,991.13 | 2,061.95 | 0.8409 | 6 | 5 |
| 22,800.87 | 1,425.05 | 0.8409 | 7 | 6 | wherein variations of the values of the corner frequency and the quality factor of the table are less than 1%, and wherein the at least one first bit-wise shift operation and the plurality of second bit-wise shift operations are realized by wiring in an application-specific integrated circuit (ASIC).

2. The filter of claim 1, wherein the at least one first multiplication approximation circuit approximates each of the at least one first coefficient into one first term comprising only one '1' in a first binary expression, the at least one second multiplication approximation circuit approximates each of the at least one second coefficient into a plurality of second terms, and each of the one first term and the plurality of second terms comprises only one '1' in a second binary expression.

3. The filter of claim 1, wherein the at least one shift bit number of the at least one first bit-wise shift operation is corresponding to a specific set of a corner frequency and a quality factor.

4. The filter of claim 1 wherein when the corner frequency is 1439.24 Hz (Hertz) at 48 ksps (kilo-samples per second) and the quality factor is 0.707, the at least one first bit-wise shift operation comprises a first right shift by 7 bits, a first right shift by 6 bits and a second right shift by 7 bits, a first one of the at least one second multiplication operation is corresponding a second right shift by 6 bits, a first right shift by 2 bits, a left shift by 1 bit and two addition operations, and a second one of the at least one second multiplication operation is corresponding a third right shift by 6 bits, a second right shift by 2 bits and one addition operation.

5. The filter of claim 1, wherein the values of a first shift bit number, a second shift bit number and a third shift bit number selected from values of the one row of the table are adaptively adjusted when corresponding ones of the at least one first coefficient are scaled.

6. The filter of claim 5, wherein when the corner frequency is 1439.24 Hz (Hertz) at 48 ksps (kilo-samples per second) and the quality factor is 0.707, the at least one first bit-wise shift operation comprises a first right shift by 5 bits, a right shift by 4 bits and a second right shift by 5 bits, a first one of the at least one second multiplication operation is corresponding a right shift by 2 bits, a left shift by 1 bit and one addition operation, and a second one of the at least one second multiplication operation is corresponding a right shift by 3 bits and one addition operation.

7. The filter of claim 1, wherein at least one set of a plurality of shift bit numbers of the plurality of second bit-wise shift operations and at least one addition number of the at least one addition operation are corresponding to a specific set of a corner frequency and a quality factor.

8. A method, the method comprising:
approximating at least one first multiplication operation corresponding to at least one first coefficient with at least one first bit-wise shift operation; and
approximating at least one second multiplication operation corresponding to at least one second coefficient with a plurality of second bit-wise shift operations and at least one addition operation,
wherein values of a first shift bit number, a second shift bit number and a third shift bit number of at least one shift bit number of the at least one first bit-wise shift operation and values of corner frequencies and quality factors are selected from values of one row of a table below with variation less than 1% for the corner frequencies and the quality factors:

| Corner frequency at 3072 ksps (kilo-samples per second) | Corner frequency at 48 ksps | Quality factor | First/third shift bit number, | Second shift bit number |
|---|---|---|---|---|
| 293,596.34 | 4,587.44 | 0.7071 | 4 | 3 |
| 196,647.43 | 3,072.62 | 0.7071 | 5 | 4 |
| 133,818.77 | 2,090.92 | 0.7071 | 6 | 5 |
| 92,111.63 | 1,439.24 | 0.7071 | 7 | 6 |
| 63,915.58 | 998.681 | 0.7071 | 8 | 7 |
| 44,600.77 | 696.887 | 0.7071 | 9 | 8 |
| 31,245.41 | 488.210 | 0.7071 | 10 | 9 |
| 21,949.60 | 342.963 | 0.7071 | 11 | 10 |
| 32,991.13 | 2,061.95 | 0.8409 | 6 | 5 |
| 22,800.87 | 1,425.05 | 0.8409 | 7 | 6 | wherein variations of the values of the corner frequency and the quality factor of the table are less than 1%, and
wherein the at least one first bit-wise shift operation and the plurality of second bit-wise shift operations are realized by wiring in an application-specific integrated circuit (ASIC).

9. The method of claim 8 further comprising:
approximating each of the at least one first coefficient into one first term comprising only one '1' in a first binary expression; and
approximating each of the at least one second coefficient into a plurality of second terms;
wherein each of the one first term and the plurality of second terms comprises only one '1' in a second binary expression.

10. The method of claim 8, wherein the at least one shift bit number of the at least one first bit-wise shift operation is corresponding to a specific set of a corner frequency and a quality factor.

11. The method of claim 8, wherein when the corner frequency is 1439.24 Hz (Hertz) at 48 ksps (kilo-samples per second) and the quality factor is 0.707, the at least one first bit-wise shift operation comprises a first right shift by 7 bits, a first right shift by 6 bits and a second right shift by 7 bits, a first one of the at least one second multiplication operation is corresponding a second right shift by 6 bits, a first right shift by 2 bits, a left shift by 1 bit and two addition operations, and a second one of the at least one second multiplication operation is corresponding a third right shift by 6 bits, a second right shift by 2 bits and one addition operation.

12. The method of claim 8, wherein the values of a first shift bit number, a second shift bit number and a third shift bit number selected from values of the one row of the table are adaptively adjusted when corresponding ones of the at least one first coefficient are scaled.

13. The method of claim 12, wherein when the corner frequency is 1439.24 Hz (Hertz) at 48 ksps (kilo-samples per second) and the quality factor is 0.707, the at least one first bit-wise shift operation comprises a first right shift by 5 bits, a right shift by 4 bits and a second right shift by 5 bits, a first one of the at least one second multiplication operation is corresponding a right shift by 2 bits, a left shift by 1 bit and one addition operation, and a second one of the at least one second multiplication operation is corresponding a right shift by 3 bits and one addition operation.

14. The method of claim 8, wherein at least one set of a plurality of shift bit numbers of the plurality of second bit-wise shift operations and at least one addition number of the at least one addition operation are corresponding to a specific set of a corner frequency and a quality factor.

* * * * *